(12) United States Patent
Matsuzaki et al.

(10) Patent No.: US 12,185,514 B2
(45) Date of Patent: Dec. 31, 2024

(54) ELECTROMAGNETIC SHIELD

(71) Applicant: NITTO DENKO CORPORATION, Ibaraki (JP)

(72) Inventors: Yuya Matsuzaki, Ibaraki (JP); Kazuhiro Fuke, Ibaraki (JP); Takehiro Ui, Ibaraki (JP); Kyohei Akiyama, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 18/275,065

(22) PCT Filed: Aug. 4, 2022

(86) PCT No.: PCT/JP2022/030030
§ 371 (c)(1),
(2) Date: Jul. 31, 2023

(87) PCT Pub. No.: WO2023/013753
PCT Pub. Date: Feb. 9, 2023

(65) Prior Publication Data
US 2024/0164073 A1   May 16, 2024

(30) Foreign Application Priority Data
Aug. 5, 2021   (JP) .................................. 2021-129338

(51) Int. Cl.
*H05K 9/00*   (2006.01)
*H01Q 1/52*   (2006.01)

(52) U.S. Cl.
CPC ............... *H05K 9/00* (2013.01); *H01Q 1/526* (2013.01)

(58) Field of Classification Search
CPC ........................... H05K 9/0081; H01Q 1/526
See application file for complete search history.

(56) References Cited

U.S. PATENT DOCUMENTS 3,623,099 A   11/1971   Suetake
3,780,374 A   12/1973   Shibano et al.
(Continued)

FOREIGN PATENT DOCUMENTS

JP   S47-24254 A   10/1972
JP   2004-280050 A   10/2004
(Continued)

OTHER PUBLICATIONS

International Search Report issued for corresponding International Patent Application No. PCT/JP2022/030030 on Oct. 25, 2022, along with an English translation (5 pages).
(Continued)

*Primary Examiner* — Hung V Ngo
(74) *Attorney, Agent, or Firm* — HAUPTMAN HAM, LLP

(57) ABSTRACT

An electromagnetic shield includes a plate-shaped base. The base has a first surface and a second surface. The second surface is distant from the first surface and extends along the first surface. The first surface includes a plurality of first recessed portions and a first solid portion. The first solid portion includes a surface in contact with an edge of the first recessed portion in the particular direction, the surface being a basis of a depth of the first recessed portion. The first solid portion has a dimension in a depth direction of the first recessed portion. The second surface includes a plurality of second recessed portions arranged alternately with the plurality of first recessed portions in the particular direction.

14 Claims, 8 Drawing Sheets

(56) References Cited

U.S. PATENT DOCUMENTS

| | | | |
|---|---|---|---|
| 2004/0070829 A1 | 4/2004 | Kurtz et al. | |
| 2015/0207217 A1* | 7/2015 | Fujita | |
| 2016/0324041 A1* | 11/2016 | Yoo | H05K 9/0088 |
| 2017/0118878 A1* | 4/2017 | Kimoto | H02G 3/0468 |
| 2018/0064003 A1* | 3/2018 | Suetani | H05K 9/0018 |
| 2019/0225810 A1 | 7/2019 | Kuzuu | |
| 2021/0041529 A1 | 2/2021 | Brown et al. | |
| 2021/0059085 A1* | 2/2021 | Yamagata | B32B 15/09 |
| 2022/0192066 A1* | 6/2022 | Zaghloul | B64C 21/10 |

FOREIGN PATENT DOCUMENTS

| | | |
|---|---|---|
| JP | 2010-230661 A | 10/2010 |
| WO | 94/26495 A1 | 11/1994 |
| WO | 2018/056106 A1 | 3/2018 |
| WO | 2021/058450 A1 | 4/2021 |

OTHER PUBLICATIONS

Written Opinion issued for corresponding International Patent Application No. PCT/JP2022/030030 on Oct. 25, 2022 (3 pages).

The Extended European Search Report issued on Nov. 7, 2024 for corresponding European Patent Application No. 22 85 3171.1 (11 pages).

* cited by examiner

ELECTROMAGNETIC SHIELD

CROSS REFERENCE TO RELATED APPLICATION

This application is a National Stage of International Application No. PCT/JP2022/030030, filed on Aug. 4, 2022, which designates the United States and was published in Japan, and which is based upon and claims priority to Japanese Patent Application No. 2021-129338, filed on Aug. 5, 2021 in the Japan Patent Office. All of the aforementioned applications are hereby incorporated by reference in their entireties.

TECHNICAL FIELD

The present invention relates to an electromagnetic shield.

BACKGROUND ART

Covers for protecting radar devices have been known.

For example, Patent Literature 1 describes a cover for vehicle radar devices, the cover being capable of reducing disturbance of directivity of radars. This radar device cover has a three-dimensional shape composed of a dielectric plate with projections and depressions. A first portion of this dielectric plate forms an angle with a wavefront of an electromagnetic wave transmitted and received by a radar device, and is thinner than a second portion, which is another portion of the dielectric plate.

Patent Literature 2 describes a side shield for radar transceivers. A non-uniform delay structure is arranged over the side shield. The non-uniform delay structure delays a radar signal propagating through the side shield by a variable amount depending on the wavelength of the radar signal and a location on the side shield through which the radar signal propagates. The radar signal is thereby steered and diffused after propagation through the side shield. The side shield has, for example, a zig-zag-shaped surface (refer to FIG. 10C). In this case, the side shield has the advantage of a uniform material thickness for molding.

CITATION LIST

Patent Literature

Patent Literature 1: JP 2010-230661 A
Patent Literature 2: WO 2021/058450 A1

SUMMARY OF INVENTION

Technical Problem

Electromagnetic shielding is conceivable for prevention of reception of unnecessary radio waves. To reduce the weight of an electromagnetic shield that can achieve such an electromagnetic shielding function, recessed portions may be provided on the electromagnetic shield.

Although the radar device cover described in Patent Literature 1 has a three-dimensional shape composed of a dielectric plate with projections and depressions, the radar device cover described in Patent Literature 1 reduces disturbance of directivity of radars by making the first portion of the dielectric plate thinner than the second portion of the dielectric plate.

Although the side shield described in Patent Literature 2 having a zig-zag-shaped surface has the advantage of a uniform material thickness for molding, it is uncertain whether a radar signal is diffused after propagation through the side shield.

Therefore, the present invention provides an electromagnetic shield that is capable of blocking an electromagnetic wave and advantageous in weight reduction.

Solution to Problem

The present invention provides an electromagnetic shield including:
 a plate-shaped base having a first surface and a second surface, the first surface being configured to allow an electromagnetic wave to be incident on the first surface, the second surface being distant from the first surface and extending along the first surface, wherein
 the electromagnetic shield includes a dielectric,
 the first surface includes: a plurality of first recessed portions arranged at a given interval in a particular direction along the first surface; and a first solid portion including a surface in contact with an edge of the first recessed portion in the particular direction, the surface being a basis of a depth of the first recessed portion, the first solid portion having a dimension in a depth direction of the first recessed portion, the dimension being equal to or greater than the depth of the first recessed portion, and
 the second surface includes a plurality of second recessed portions arranged alternately with the plurality of first recessed portions in the particular direction.

Advantageous Effects of Invention

The above electromagnetic shield is capable of blocking an electromagnetic wave and advantageous in weight reduction.

DESCRIPTION OF EMBODIMENTS

Hereinafter, embodiments of the present invention will be described with reference to the drawings. The present invention is not limited to the following embodiments.

Figure 1A:
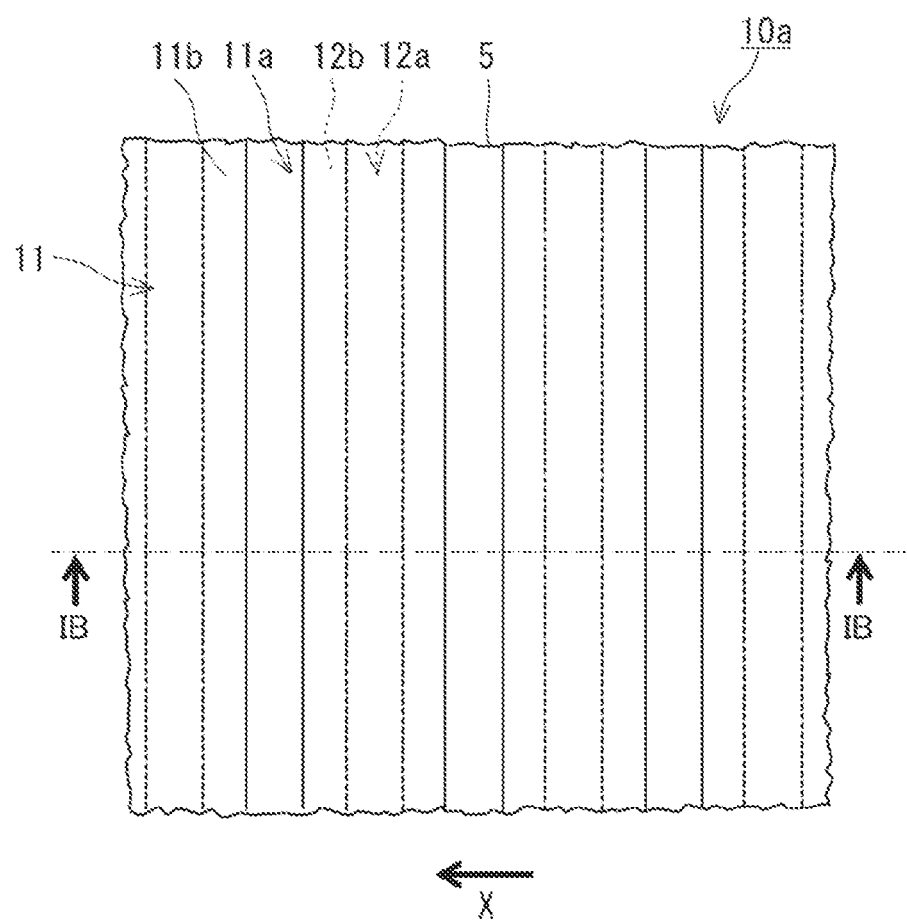
FIG. 1A is a plan view of an example of the electromagnetic shield according to the present invention.
Figure 1B:
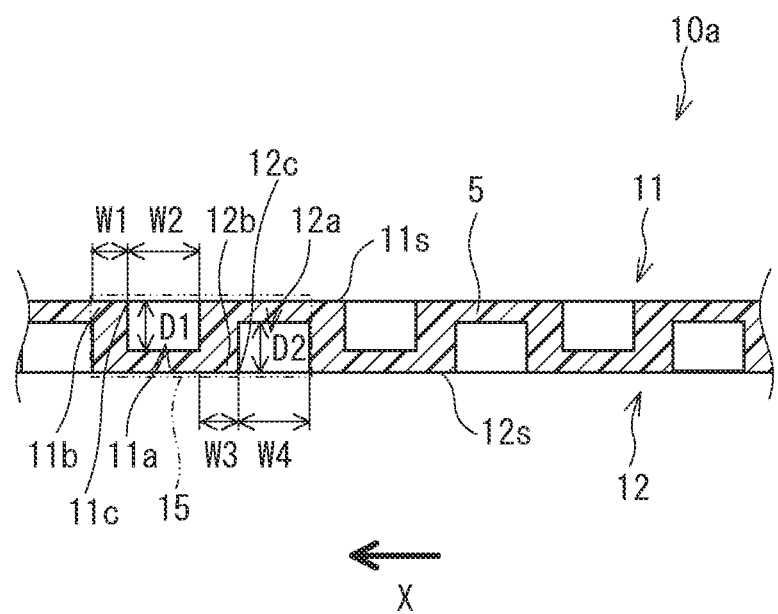
FIG. 1B is a cross-sectional view of the electromagnetic shield taken along a line IB-IB shown in FIG. 1A.
Figure 1C:
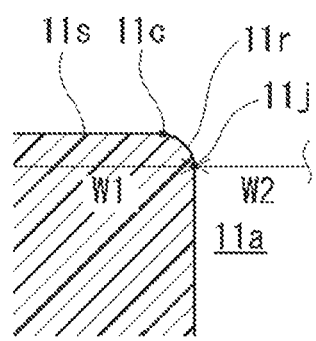
FIG. 1C is a cross-sectional view of a variation of the electromagnetic shield.

As shown in FIGS. 1A and 1B, an electromagnetic shield 10a includes a plate-shaped base 5. The base 5 has a first surface 11 and a second surface 12. The first surface 11 is a surface configured to allow an electromagnetic wave to be incident on the first surface 11. The second surface 12 is distant from the first surface 11 and extends along the first surface 11. The electromagnetic shield 10a includes a dielectric. The first surface 11 includes a plurality of first recessed portions 11a and a first solid portion 11b. The plurality of first recessed portions 11a are arranged at a given interval in a particular direction (X-axis direction) along the first surface 11. The first solid portion 11b includes a surface 11s in contact with an edge 11c of the first recessed portion 11a in the particular direction, the surface 11s being a basis of a depth of the first recessed portion 11a. Additionally, the first solid portion 11b has a dimension in a depth direction of the first recessed portion 11a, the dimension being equal to or greater than a depth D1 of the first recessed portion 11a. The second surface 12 includes a plurality of second recessed portions 12a arranged alternately with the plurality of first recessed portions 11a in the particular direction.

The term "electromagnetic shield" herein refers to an article that can exhibit a function of attenuating the energy of an electromagnetic wave. The principle on which an electromagnetic shield attenuates the energy of an electromagnetic wave is not limited to a particular principle. The principle can be, for example, one using a phenomenon, such as reflection, transmission, absorption, diffraction, or interference, accompanying an interaction between an electromagnetic wave and an electromagnetic shield and a phenomenon, such as scattering or diffusion of the electromagnetic wave, caused by the above phenomenon. A given electromagnetic wave is incident on the first surface 11 of the electromagnetic shield 10a, the energy of the electromagnetic wave is attenuated.

Figure 2:
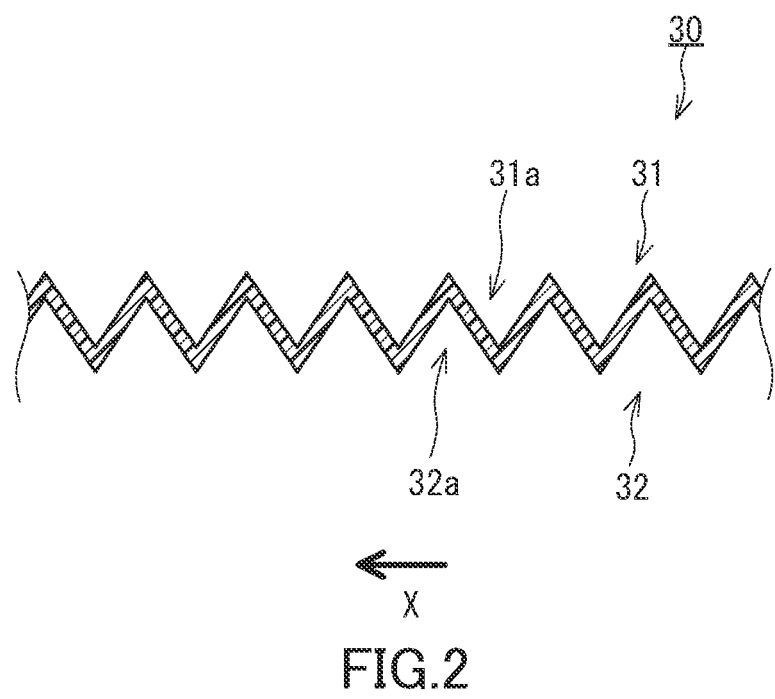
FIG. 2 is a cross-sectional view of a component according to a reference example.

FIG. 2 is a cross-sectional view of a component 30 according to a reference example. The component 30 is, for example, formed of the same material as that of the electromagnetic shield 10a. As shown in FIG. 2, the component 30 includes a first surface 31 and a second surface 32. A plurality of recessed portions 31a are provided in the first surface 31, and a plurality of recessed portions 32a are provided in the second surface 32. The plurality of recessed portions 31a and the plurality of recessed portions 32a are alternately arranged in a particular direction (X-axis direction) along the first surface 31. The component 30 is, for example, a zig-zag-shaped board, and a pair of the recessed portions 31a adjacent to each other are in contact with each other in the particular direction. In other words, in the component 30, the width of a portion corresponding to the first solid portion 11b of the electromagnetic shield 10a is substantially zero. An edge of the recessed portion in the first surface 31 in the particular direction and a bottom of the recessed portion in the second surface 32 are at the same position in the particular direction. The component 30 hardly blocks an electromagnetic wave incident on the first surface 31. On the other hand, the electromagnetic shield 10a blocks an electromagnetic wave incident on the first surface 11. Moreover, since the plurality of second recessed portions 12a are provided in the second surface 12 of the electromagnetic shield 10a alternately with the plurality of first recessed portions 11a, the electromagnetic shield 10a is likely to have a reduced weight. Furthermore, the electromagnetic shield 10a is likely to have a high impact resistance.

A wavelength A of an electromagnetic wave to be incident on the electromagnetic shield 10a is not limited to a particular value. The wavelength A is, for example, 1 mm to 30 mm.

As shown in FIG. 1B, the two surfaces of the first solid portion 11b are, for example, parallel to each other and flat.

The electromagnetic shield 10a can be used, for example, as an electromagnetic shield for millimeter-wave radars, millimeter-wave radio communication, millimeter-wave sensing, or the like. A device including the electromagnetic shield 10a can be used, for example, in automobiles and wireless base stations. When the electromagnetic shield 10a is for millimeter-wave radars, the electromagnetic shield 10a can be included in a millimeter-wave radar using one frequency band selected from the group consisting of the 24 GHz band, the 60 GHz band, the 76 GHz band, and the 79 GHz band. The electromagnetic shield 10a is not just for blocking only an electromagnetic wave with a particular wavelength, and may block electromagnetic waves in a wide wavelength region. It is also possible to regard an electromagnetic wave with a particular wavelength $\lambda$ as a "shielding target" of the electromagnetic shield 10a. For example, in the case of the electromagnetic shield installed with a vehicle-mounted millimeter-wave radar configured to irradiate an object with an electromagnetic wave practically having frequencies of 76 to 77 GHz, i.e., having practical irradiation wavelengths of 3.89 to 3.94 mm, 3.92 mm which is the wavelength of the center frequency, 76.5 GHz, can be understood as the wavelength $\lambda$, namely, the shielding target of this electromagnetic shield. In the case where the electromagnetic shield is for vehicle-mounted millimeter-wave radars using an electromagnetic wave having frequencies of 77 to 81 GHz, i.e., using an electromagnetic wave having wavelengths of 3.70 to 3.89 mm, 3.79 mm, which is the wavelength of the center frequency, 79 GHz, can be understood as the wavelength $\lambda$, namely, the shielding target of this electromagnetic shield. In the case where the electromagnetic shield is for vehicle-mounted millimeter-wave radars using an electromagnetic wave having frequencies of 24.05 to 24.25 GHz, i.e., using an electromagnetic wave having wavelengths of 12.36 to 12.47 mm, 12.41 mm, which is the wavelength of the center frequency, 24.15 GHz, can be understood as the wavelength $\lambda$, namely, the shielding target of this electromagnetic shield. In the case where the electromagnetic shield is for vehicle-mounted millimeter-wave radars using an electromagnetic wave having frequencies of 60.0 to 60.1 GHz, i.e., using an electromagnetic wave having wavelengths of 4.99 to 5.00 mm, 4.99 mm, which is the wavelength of the center frequency, 60.05 GHz, can be understood as the wavelength $\lambda$, namely, the shielding target of this electromagnetic shield. In the case where the electromagnetic shield is for millimeter-wave radio communication using an electromagnetic wave having frequencies of 27 to 29.5 GHz, i.e., using an electromagnetic wave having wavelengths of 10.16 to 11.10 mm, 10.61 mm, which is the wavelength of the center frequency, 28.25 GHz, can be understood as the wavelength $\lambda$, namely, the shielding target of this electromagnetic shield. In the case where the electromagnetic shield is, for example, sold with a label saying that its supporting frequencies are 70 to 90 GHz, i.e., its supporting wavelengths are 3.33 to 4.28 mm, 3.75 mm, which is the wavelength of the center frequency, 80 GHz, can be understood as the wavelength $\lambda$, namely, the shielding target of this electromagnetic shield.

An opening width W2 of the first recessed portion 11a in particular direction is defined, for example, as a width of an outermost part of the first recessed portion 11a. As shown in FIG. 10, the first solid portion 11b of the electromagnetic shield 10a may have a curved surface 11r near the edge 11c of the first recessed portion 11a. In this case, the opening width W2 is determined at an end 11j of the curved surface 11r on an inner side of the first recessed portion 11a. Additionally, a width W1 of the first solid portion 11b is also determined at the end 11j.

The depth D1 of the first recessed portion 11a, the opening width W2 of the first recessed portion 11a in the particular direction, and the width W1 of the first solid portion 11b in the particular direction are not limited to particular values as long as an electromagnetic wave incident on the first surface 11 is blocked.

When the depth D1 is compared with the particular wavelength λ, namely, the shielding target of the electromagnetic shield 10a, the depth D1 is, for example, 0.50λ to 2.10λ. With such a configuration, an electromagnetic wave incident on the first surface 11 is more likely to be blocked in a desired state. The depth D1 may be 0.60λ or more, 0.70λ or more, or 0.80λ or more. The depth D1 may be 2.0λ or less, 1.9λ or less, or 1.8λ or less.

When the opening width W2 is compared with the particular wavelength λ, namely, the shielding target of the electromagnetic shield 10a, the opening width W2 is, for example, 0.50λ to 2.10λ. With such a configuration, an electromagnetic wave incident on the first surface 11 is more likely to be blocked in a desired state. The opening width W2 may be 0.60λ or more, 0.70λ or more, or 0.80λ or more. The opening width W2 may be 2.0λ or less, 1.9λ or less, or 1.8λ or less.

When the width W1 is compared with the particular wavelength λ, namely, the shielding target of the electromagnetic shield 10a, the width W1 is, for example, 0.20λ to 2.0λ. With such a configuration, an electromagnetic wave incident on the first surface 11 is more likely to be blocked in a desired state. The width W1 may be 0.30λ or more, 0.40λ or more, or 0.50λ or more. The width W1 may be 1.9λ or less, 1.8λ or less, or 1.7λ or less.

In the electromagnetic shield 10a, a ratio W1/(W1+W2) of the width W1 to a sum (W1+W2) of the width W1 and the opening width W2 is not limited to a particular value. The ratio W1/(W1+W2) is, for example, 0.1 to 0.9. With such a configuration, an electromagnetic wave incident on the first surface 11 is more likely to be blocked in a desired state. The ratio W1/(W1+W2) may be 0.15 or more, 0.2 or more, or 0.3 or more. The ratio W1/(W1+W2) may be 0.8 or less, 0.75 or less, or 0.7 or less.

As shown in FIG. 1A, the first recessed portion 11a extends, for example, along a direction perpendicular to the particular direction in an in-plane direction of the first surface 11. The plurality of first recessed portions 11a extend, for example, linearly and parallel to each other in plan view. The plurality of first recessed portions 11a each may extend in a curve or in a zigzag manner in plan view.

The plurality of first recessed portions 11a may be arranged to make a square lattice, a rectangular lattice, or a parallelogram lattice in plan view. In this case, the shape of each first recessed portion 11a in plan view may be, for example, a polygon such as a square or a regular hexagon, or may be a circle.

As shown in FIG. 1B, in the electromagnetic shield 10a, a side surface of the first recessed portion 11a extends, for example, toward the second surface 12 and perpendicularly to the particular direction. In other words, the side surface of the first recessed portion 11a is parallel to a plane perpendicular to the particular direction.

The shape of the second recessed portion 12a is not limited to a particular shape. The second recessed portion 12a has, for example, the same shape as the first recessed portion 11a. In this case, a depth D2 of the second recessed portion 12a is the same as the depth D1 of the first recessed portion 11a, and an opening width W4 of the second recessed portion 12a in the particular direction is the same as the opening width W2. Such a structural feature makes it easy to manufacture the electromagnetic shield 10a. The second recessed portion 12a may have a shape different from the first recessed portion 11a.

As shown in FIG. 1B, the second surface 12 includes, for example, a second solid portion 12b. The second solid portion 12b includes a surface 12s in contact with an edge 12c of the second recessed portion 12a in the particular direction, the surface 12s being a basis of a depth of the second recessed portion 12a. Moreover, the second solid portion 12b has a dimension in a depth direction of the second recessed portion 12b, the dimension being equal to or greater than the depth D2 of the second recessed portion 12b. The second solid portion 12b has, for example, the same shape as the first solid portion 11b. In this case, a width W3 of the second recessed portion 12a in the particular direction is the same as the width W1. Such a structural feature makes it easy to manufacture the electromagnetic shield 10a.

Figure 1D:
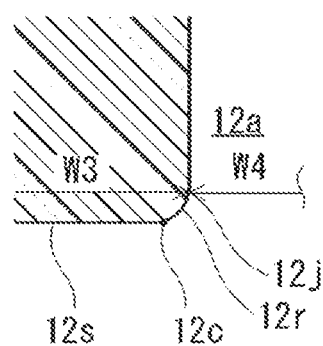
FIG. 1D is a cross-sectional view of a variation of the electromagnetic shield.

The opening width W4 of the second recessed portion 12a in the particular direction is defined, for example, as a width of an outermost part of the second recessed portion 12a. As shown in FIG. 1D, the second solid portion 11b of the electromagnetic shield 10a may have a curved surface 12r near the edge 12c of the second recessed portion 12a. In this case, the opening width W4 is determined at an end 12j of the curved surface 12r on an inner side of the second recessed portion 12a. Additionally, the width W3 of the second solid portion 12b is also determined at the end 12j.

As shown in FIG. 1B, in the electromagnetic shield 10a, the first surface 11 and the second surface 12 are configured such that a unit structure 15 repeats in the particular direction. The unit structure 15 is a structure including the first recessed portion 11a, the second recessed portion 12a, the first solid portion 11b, and the second solid portion 12b. With such a configuration, the electromagnetic shield 10a is likely to have uniform electromagnetic shielding properties in its in-plane direction.

As shown in FIG. 1B, a dimension of a solid portion of the electromagnetic shield 10a in the depth direction of the first recessed portion 11a, for example, cyclically varies in the particular direction. The dimension is, for example, largest in the first solid portion 11b and the second solid portion 12b, and is smaller in the first recessed portion 11a and the second recessed portion 12a. The dimension of the solid portion of the electromagnetic shield 10a in the depth direction of the first recessed portion 11a may be constant in the particular direction.

As shown in FIG. 1B, a pair of the first recessed portion 11a and the second recessed portion 12a adjacent to each other in the particular direction are, for example, apart from each other in the particular direction. A pair of portion of the first recessed portion 11a and portion of the second recessed portion 12a adjacent to each other in the particular direction may overlap in the particular direction.

As described above, the electromagnetic shield 10a includes a dielectric. The material of the dielectric is not limited to a particular one. The electromagnetic shield 10a includes, for example, a resin as the dielectric. In this case, the cost of manufacturing the electromagnetic shield 10a is likely to be low. For example, an imaginary part E″ of a complex relative permittivity of the dielectric at at least one frequency in a range of 10 GHz to 300 GHz is 0.1 or less. The imaginary part E″ is desirably 0.07 or less, more desirably 0.05 or less, and even more desirably 0.01 or less.

A real part £′ of a complex relative permittivity of the resin at at least one frequency in the range of 10 GHz to 300 GHz is, for example, 2 or more and 4 or less. The real part £′ is desirably 2.1 or more and 3.5 or less, and more desirably 2.2 or more and 3.0 or less. The real part £′ may be 3.8 or less, 3.6 or less, 3.4 or less, 3.2 or less, 3.0 or less, 2.8 or less, 2.6 or less, or 2.4 or less.

The resin included in the electromagnetic shield 10a is not limited to a particular resin. The resin is, for example, a thermoplastic resin. Examples of the resin include polyethylene, polypropylene, polyvinyl alcohol, polyethylene terephthalate, polybutylene terephthalate, ethylene-vinyl acetate copolymer, polystyrene, acrylonitrile styrene, acrylonitrile-butadiene-styrene copolymer, ASA resin, AES resin, acrylic resins such as PMMA, MS resin, MBS resin, cycloolefin resin, polyacetal resin, polyamide resin, polyester resin, polycarbonate resin, polyurethane resin, liquid crystal polymer, EPDM, PPS, PEEK, PPE, polysulfone-based resin, polyimide-based resin, fluorine resin, thermoplastic elastomers such as an olefin-based thermoplastic elastomer (TPO), and acrylic elastomers. The resin may be a thermosetting resin. The thermosetting resin is, for example, an epoxy resin, an acrylic resin, or a silicone resin. The electromagnetic shield 10a may include only one resin or two or more resins.

The electromagnetic shield 10a may include, for example, a filler. The filler may be a colorant such as carbon black, an inorganic reinforcement such as talc, glass fibers, or a mineral, or a softener. The electromagnetic shield 10a may include an additive such as a flame retardant or a plasticizer. The electromagnetic shield 10a may be free of a filler. In this case, the cost of manufacturing the electromagnetic shield 10a is likely to be low.

The electromagnetic shield 10a is, for example, free of an electrically conductive portion. For blocking an electromagnetic wave, for example, an electrically conductive portion such as a metal film may be used to reflect an electromagnetic wave. However, the electromagnetic shield 10a can block an electromagnetic wave without an electrically conductive portion. The electromagnetic shield 10a may consist of the dielectric. The electromagnetic shield 10a may include an electrically conductive portion.

The electromagnetic shield 10a is, for example, a resin molded article. In this case, the method for molding the electromagnetic shield 10a is not limited to a particular method. The electromagnetic shield 10a can be manufactured by injection molding, press molding, blow molding, or vacuum molding. The electromagnetic shield 10a may be manufactured by cutting or 3D printing.

For the electromagnetic shield 10a, an interaction occurring between the electromagnetic shield 10a and an electromagnetic wave due to blocking of the electromagnetic wave is not limited to a particular interaction. The electromagnetic shield 10a, for example, transmits at least a portion of an electromagnetic wave incident on the first surface 11 and allows a scattered electromagnetic wave to emerge from the second surface 12. In other words, the electromagnetic shield 10a can function as a radio-wave transmitting-scattering body. Electromagnetic shielding can therefore be achieved with a simple configuration. In this case, for the electromagnetic shield 10a, the depth D1 of the first recessed portion 11a, the opening width W2 of the first recessed portion in the particular direction, and the width W1 of the first solid portion 11b in the particular direction are determined so that an electromagnetic wave incident on the first surface 11 will emerge in a scattered state from the second surface 12.

When an electromagnetic wave with a wavelength λ is perpendicularly incident on the first surface 11 of the electromagnetic shield 10a, a transmission loss in a straight direction of the electromagnetic wave is not limited to a particular value. It is understood that the greater the transmission loss in the straight direction is, the more likely the electromagnetic wave incident on the first surface 11 is to emerge in a scattered state from the second surface 12. The transmission loss in the straight direction is, for example, 2.0 dB or more, and desirably 2.5 dB or more.

Figure 3:
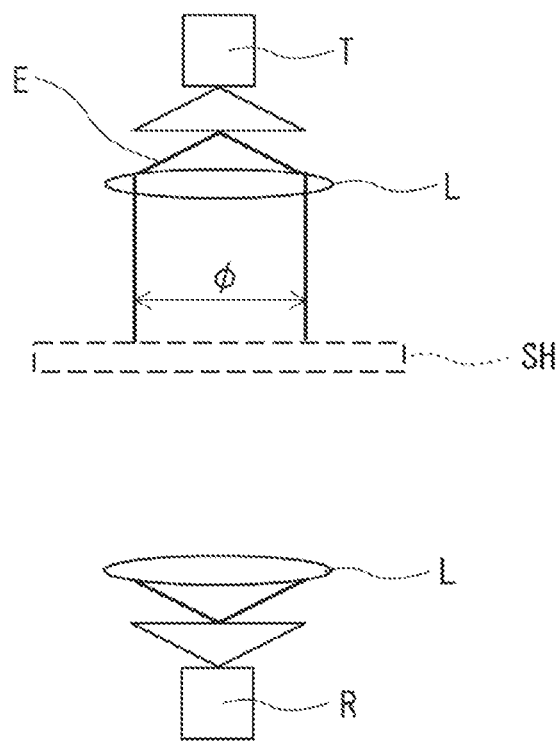
FIG. 3 schematically shows how to measure a transmission loss.

The transmission loss of the electromagnetic shield 10a in the straight direction can be determined, for example, by measurement with reference to Japanese Industrial Standards (JIS) R 1679: 2007. This measurement can be performed, for example, using a measurement system shown in FIG. 3. A sample holder SH, a millimeter-wave lens L, a transmitter T, and a receiver R were disposed as shown in FIG. 3. For example, the sample holder SH is irradiated with an electromagnetic wave E transmitted by the transmitter T and adjusted to have a diameter (beam diameter) of 30 mm by the millimeter-wave lens L. Transmission and reception of the electromagnetic wave E is performed without anything on the sample holder SH, and a state where the transmission loss is 0 dB (the electromagnetic wave is all transmitted) is used to determine a reference level for measurement of a transmission loss obtained by incidence in a direction perpendicular to a surface of each sample. Then, after a sample of the electromagnetic shield 10a is set on the sample holder SH, the receiver R is disposed such that the transmitter T and the receiver R are in a straight line in a direction perpendicular to a principal surface, which corresponds to the first surface 11 of the electromagnetic shield 10a, of the sample. In this condition, transmission and reception of the electromagnetic wave E with a wavelength λ is performed, and the transmission loss in the straight direction is measured. The transmission loss is expressed by the following equation (1). In the equation (1), $P_I$ is a received electric power, and $P_0$ is a transmitted electric power. "Log" represents a common logarithm.

$$\text{Transmission loss} = |10 \, \text{Log}(P_I/P_0)| \qquad \text{Equation (1)}$$

The electromagnetic shield 10a can function, for example, as a diffraction grating. Regarding light diffraction, a zero-order light transmittance $I_0$ through a diffraction grating having a rectangular cross-section is expressed by the following equation (2) in accordance with a scalar diffraction theory. In the equation (2), $\varepsilon_R$ is the real part of the relative permittivity of the material forming the diffraction grating, and sqrt($\varepsilon_R$) is a square root of $\varepsilon_R$. The symbol h is a height of a projecting portion of the diffraction grating. The symbol λ is the wavelength of light.

$$I_0 = \cos^2(\pi \cdot |\text{sqrt}(\varepsilon_R)| - 1 \cdot (h/\lambda)) \qquad \text{Equation (2)}$$

According to Bragg's law, a direction (scattering angle) of a scattered-transmitted wave generated by diffraction is determined by a pitch of projecting portions of a diffraction grating. Constructive interference and destructive interference between diffraction waves having passed through between the projecting portions generate an interference fringe. It is thought that in this case, a transmitted-scattered wave is observed as a result of constructive interference between diffraction waves. Constructive interference between diffraction waves can be expressed by an equation (3), while destructive interference between diffraction waves can be expressed by an equation (4). In the equations (3) and (4), d is a pitch of projecting portions of a diffraction grating, θ is an angle at which constructive interference or destructive interference between diffraction waves occurs, m is an integer of 0 or greater, and λ is the wavelength of an incident wave. It is understood that when λ is constant, the scattering angle of a transmitted-scattered wave can vary depending on the pitch of the projecting portions of the diffraction grating. Table 1 shows an example of a relation between the scattering angle θ at which constructive interference between diffraction waves occurs and the pitch d.

$$d \sin \theta = m\lambda \quad \text{Equation (3)}$$

$$d \sin \theta = (m+1/2)\lambda \quad \text{Equation (4)}$$

TABLE 1

| Scattering angle θ | Interference | Pitch d [mm] of projecting portions of diffraction grating | | | | | | | | |
|---|---|---|---|---|---|---|---|---|---|---|
| | | 4 | 5 | 6 | 7 | 8 | 9 | 10 | 11 | 12 |
| Order of diffraction m | 0 Constructive | 0° | 0° | 0° | 0° | 0° | 0° | 0° | 0° | 0° |
| | 0 Destructive | 29° | 23° | 19° | 16° | 14° | 13° | 11° | 10° | 9° |
| | 1 Constructive | 79° | 52° | 41° | 34° | 29° | 26° | 23° | 21° | 19° |
| | 1 Destructive | — | — | 79° | 57° | 47° | 41° | 36° | 32° | 29° |
| | 2 Constructive | — | — | — | — | 79° | 61° | 52° | 45° | 41° |
| | 2 Destructive | — | — | — | — | — | — | 79° | 63° | 55° |
| | 3 Constructive | — | — | — | — | — | — | — | — | 79° |

These were discussed with reference to the light diffraction theory, but it is difficult to apply this to millimeter waves. The reason is that it is necessary to take into account the fact that radio waves, particularly, millimeter waves and quasi-millimeter waves, have a wavelength which is three or more orders of magnitude greater than that of visible light. For example, millimeter waves are characterized, for example, by poor straightness (a high likelihood of diffraction) compared to visible light and a high likelihood of transmission through objects such as plastic walls and paper compared to visible light, and these characteristics need to be taken into account in designing.

Figure 4:
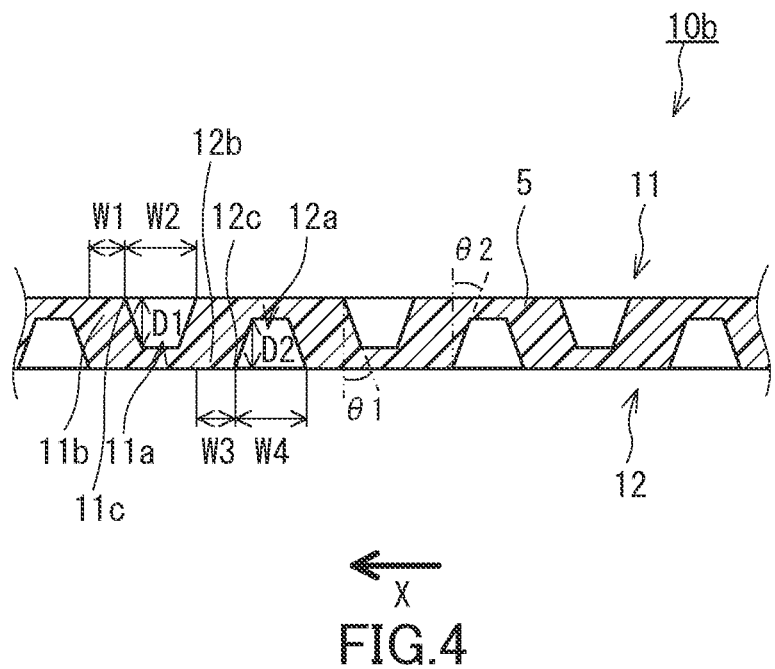
FIG. 4 is a cross-sectional view of another example of the electromagnetic shield according to the present invention.
Figure 5:
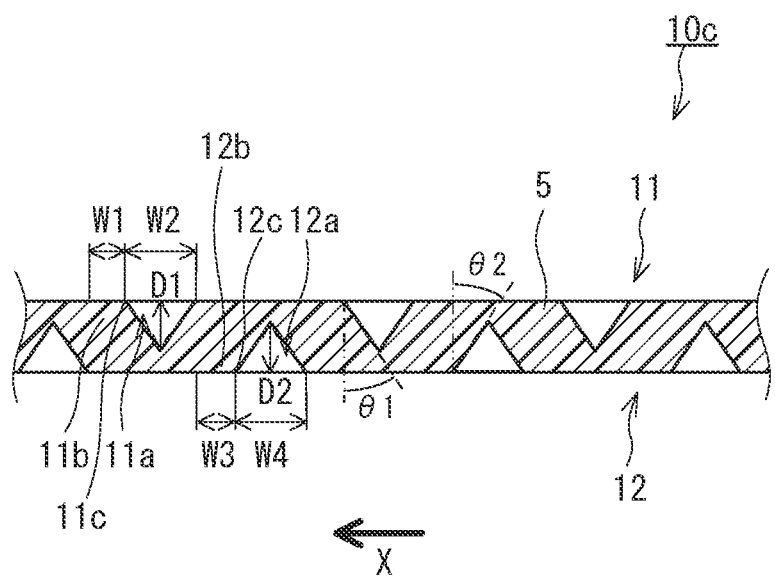
FIG. 5 is a cross-sectional view of yet another example of the electromagnetic shield according to the present invention.

The electromagnetic shield 10a can be modified in various respects. The electromagnetic shield 10a may be modified to an electromagnetic shield 10b as shown in FIG. 4 or an electromagnetic shield 10c as shown in FIG. 5. Each of the electromagnetic shield 10b and the electromagnetic shield 10c is configured in the same manner as the electromagnetic shield 10a unless otherwise described. The components of the electromagnetic shield 10b and the electromagnetic shield 10c that are the same as or correspond to the components of the electromagnetic shield 10a are denoted by the same reference characters, and detailed descriptions of such components are omitted. The description given for the electromagnetic shield 10a applies to the electromagnetic shield 10b and the electromagnetic shield 10c, unless there is technical inconsistency.

As shown in FIGS. 4 and 5, in the electromagnetic shield 10b and the electromagnetic shield 10c, the side surface of the first recessed portion 11a is tapered toward the second surface 12. In the electromagnetic shield 10b, a center of the first recessed portion 11a in the particular direction has a flat bottom surface. In the electromagnetic shield 10c, the first recessed portion 11a is in a wedge shape. Such structural features make it easy to take a molded article out of a die in manufacturing of the electromagnetic shield 10b and the electromagnetic shield 10c by molding.

In the electromagnetic shield 10b and the electromagnetic shield 10c, an angle θ1 formed by the side surface of the first recessed portion 11a with a plane perpendicular to the particular direction is not limited to a particular value. The angle θ1 is, for example, more than 0° and 30° or less. With such a configuration, an electromagnetic wave incident on the first surface 11 is more likely to be blocked in a desired state. For example, the angle θ1 is determined by a side surface extending straight from a bottom of the first recessed portion 11a toward the edge 11c of the first recessed portion 11a.

In the electromagnetic shield 10b and the electromagnetic shield 10c, an angle θ2 formed by a side surface of the second recessed portion 12a with a plane perpendicular to the particular direction is not limited to a particular value. The angle θ2 is, for example, more than 0° and 30° or less. The angle θ2 may be the same as the angle θ1, or may be different from the angle θ1. For example, the angle θ2 is determined by a side surface extending straight from a bottom of the second recessed portion 12a toward the edge 12c of the second recessed portion 12a.

Figure 6:
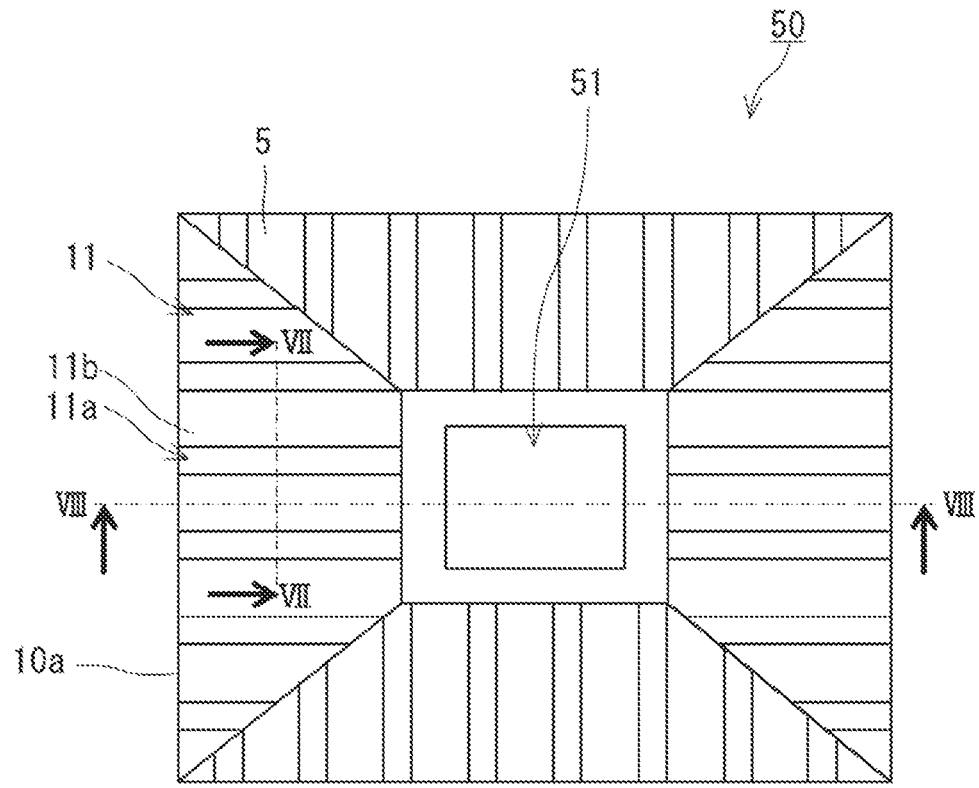
FIG. 6 is a plan view of yet another example of the electromagnetic shield according to the present invention.
Figure 7:
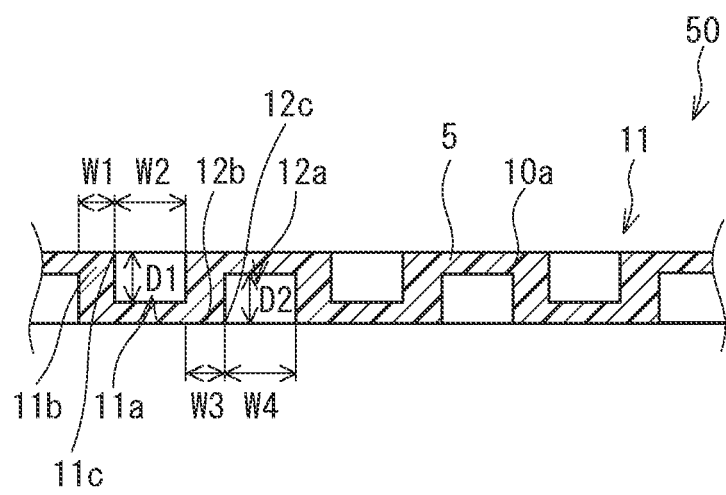
FIG. 7 is a cross-sectional view of the electromagnetic shield taken along a line VII-VII shown in FIG. 6.
Figure 8:
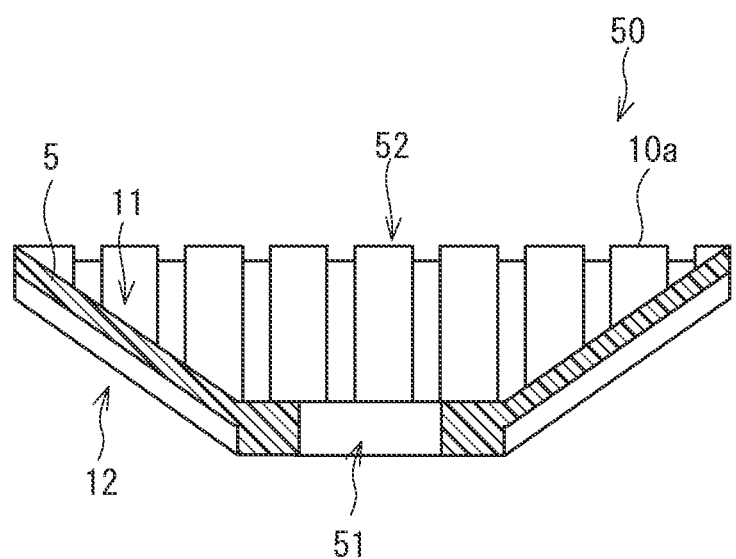
FIG. 8 is a cross-sectional view of the electromagnetic shield taken along a line VIII-VIII shown in FIG. 6.

As shown in FIGS. 6, 7, and 8, at least one selected from the group consisting of the electromagnetic shield 10a and the base 5 is, for example, a ring-shaped body and has a polygonal or circular outer perimeter when the first surface 11 is viewed along an axis of the ring-shaped body. Such a configuration can block an electromagnetic wave incident on the first surface 11 through a space surrounded by the electromagnetic shield 10a.

As shown in FIGS. 6, 7, and 8, an outer shape of at least one of the electromagnetic shield 10a and the base 5 is, for example, a truncated pyramidal shape. At least one of the electromagnetic shield 10a and the base 5 is, for example, a hollow body having an opening in each of positions in the outer shape, the positions corresponding to an upper base and a lower base of a truncated pyramid. At least one of the electromagnetic shield 10a and the base 5 has, for example, a first opening 51 in a position corresponding to the upper base of a truncated pyramid and a second opening 52 in a position corresponding to the lower base thereof. The first surface 11 defines an inner peripheral surface of the hollow body being the electromagnetic shield 10a or the base 5. The second surface 12 defines an outer peripheral surface of the hollow body being the electromagnetic shield 10a or the base 5. With such a configuration, electromagnetic shielding by the electromagnetic shield 10a can be achieved in a larger space. Furthermore, the first opening 51 of the electromagnetic shield 10a can be used to dispose an antenna for transmission and reception of an electromagnetic wave. The outer shape of at least one of the electromagnetic shield 10a and the base 5 may be a truncated conical shape or a truncated elliptical conical shape. In this case, the electromagnetic shield 10a has an opening in each of positions in the outer shape, the positions corresponding to the upper base and the lower base of a truncated cone or a truncated elliptic cone.

Figure 9:
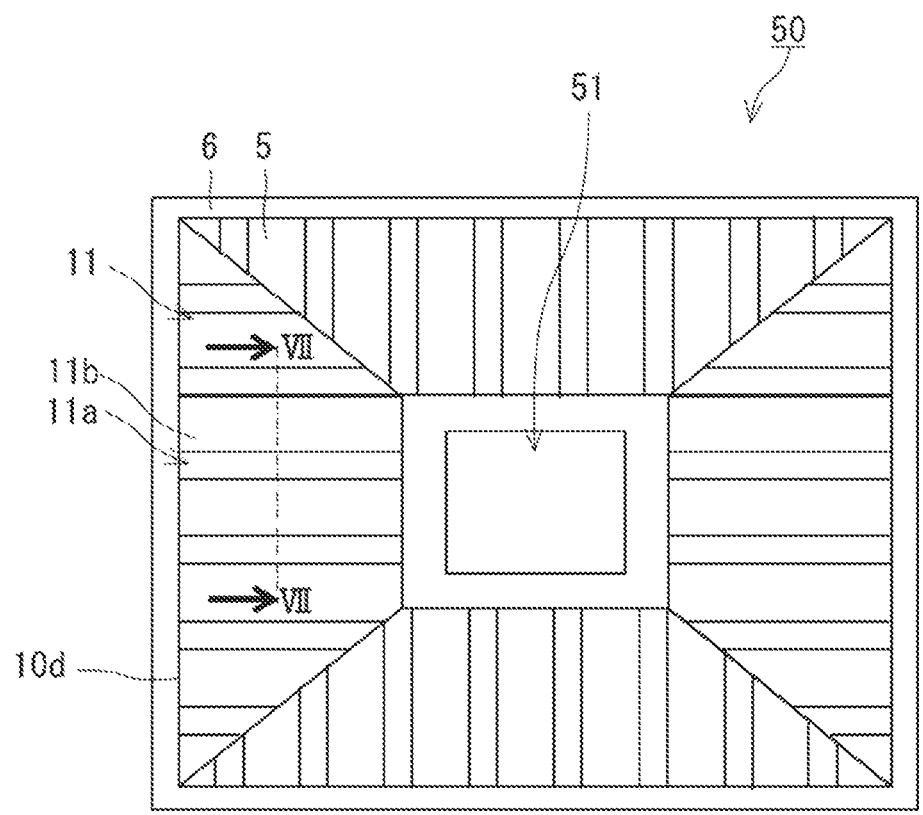
FIG. 9 is a plan view of yet another example of the electromagnetic shield according to the present invention.

The electromagnetic shield 10a may be modified, for example, to an electromagnetic shield 10d shown in FIG. 9. The electromagnetic shield 10d is configured in the same manner as the electromagnetic shield 10a unless otherwise described. As shown in FIG. 9, the electromagnetic shield 10d further includes, for example, a contact portion 6. The contact portion 6 is a portion configured to be in contact with a component other than the electromagnetic shield 10d. The contact portion 6 abuts on a polygonal or circular outer perimeter seen when the first surface 11 is viewed along the axis of the electromagnetic shield 10d or the base 5 being a ring-shaped body. With such a configuration, the electromagnetic shield 10d can be attached to another component with the contact portion 6 in contact with the other component. The contact portion 6 forms, for example, a flange.

As shown in FIGS. 6, 7, 8, and 9, for example, a radar cover 50 including the electromagnetic shield 10a or 10d can be provided. The radar cover 50 can block an unnecessary electromagnetic wave traveling toward a radar. This makes reception of the unnecessary electromagnetic wave by the radar less likely.

As shown in FIGS. 6, 8, and 9, the radar cover 50 is, for example, in the shape of a hollow truncated pyramid, and has the first opening 51 and the second opening 52. The first opening 51 and the second opening 52 are each rectangular. The second opening 52 is greater than the first opening 51. For example, a transmission and reception antenna of a radar (not illustrated) is disposed in the first opening 51. A portion of an internal surface of the radar cover 50 is formed of the first surface 11 of the electromagnetic shield 10a, and a portion of an external surface of the radar cover 50 is formed of the second surface 12 of the electromagnetic shield 10a.

EXAMPLES

The present invention will be described hereinafter in more details by examples. The present invention is not limited to the examples given below. First, evaluation methods for Examples and Comparative Examples will be described.
[Transmission Loss]

A radio wave having a frequency of 77 GHz and a diameter of 30 mm was allowed to be incident on one principal surface of each of samples according to Examples and Comparative Examples to measure a transmission loss in a straight direction using a radio transceiver EAS02 manufactured by KEYCOM Corporation with reference to JIS R 1679: 2007. The wavelength λ of this radio wave was 3.90 mm. This measurement was performed in the same manner as in the measurement in which a measurement system shown in FIG. 3 is used. A distance between an antenna and a measurement specimen was determined with reference to 8.2.2 Measurement Direction and Accompanying Document H in JIS R 1679: 2007. In this measurement, in the case of a sample having no recessed portions, the radio wave was incident perpendicularly to one, flat, principal surface; and in the case of a sample having recessed portions, the radio wave was incident along a direction perpendicular to a flat surface located between a pair of the recessed portions in one principal surface. Moreover, in the case of a sample having recessed portions, the radio wave was generated such that an amplitude direction of an electromagnetic field of the radio wave coincided with a direction perpendicular to a longitudinal direction of the recessed portion. In this measurement, in the case of a sample having recessed portions, the sample was moved in the direction perpendicular to the longitudinal direction of the recessed portion to determine the smallest value of the absolute value of the transmission loss. The transmission loss was determined by the above equation (1). Table 2 shows the results.

Example 1-1

A plate-shaped sample having two surfaces where a plurality of recessed portions were aligned in the particular direction at a given interval was obtained using polypropylene (PP). A sample according to Example 1 was thus obtained. The real part ε' of the complex relative permittivity of PP at 77 GHz was 2.3, and the imaginary part ε" of the complex relative permittivity of PP at 77 GHz was 0.0. One principal surface of the sample according to Example 1 was formed as a principal surface (incident-side principal surface) on which a radio wave is incident, and the other principal surface of the sample was formed as a principal surface (emerging-side principal surface) from which a radio wave emerges. The plurality of recessed portions in the incident-side principal surface and the plurality of recessed portions in the emerging-side principal surface were alternately arranged in the particular direction. When the incident-side principal surface or the emerging-side principal surface was viewed in plan, each recessed portion linearly extended along a direction perpendicular to the particular direction (a direction in which the plurality of recessed portions were aligned). Each recessed portion had the same shape, and a side surface of the recessed portion in the incident-side principal surface extended toward the emerging-side principal surface and perpendicularly to the particular direction. A bottom surface of each recessed portion was a flat surface. Thus, each recessed portion was rectangular in a cross-section of the sample, the cross-section being perpendicular to the particular direction and the longitudinal direction of the recessed portion. The depth of each recessed portion was 4 mm, and the width of the recessed portion in the particular direction was 4 mm. The sample according to Example 1 had a solid portion forming a surface in contact with an edge of the recessed portion in the incident-side principal surface in the particular direction, the surface being a basis of the depth of the recessed portion. A dimension of the solid portion in the depth direction of the recessed portion was 8 mm. The two surfaces of this solid portion were parallel to each other and flat. The thickness (the dimension in the depth direction of the recessed portion) of this solid portion was a largest thickness in the sample according to Example 1. The width of the solid portion in the particular direction was 4 mm.

Example 1-2 to Example 1-7

Samples according to Example 1-2, Example 1-3, Example 1-4, Example 1-5, Example 1-6, and Example 1-7 were obtained in the same manner as in Example 1-1, except for the following points. The depths of the grooves of the recessed portions of Example 1-2, Example 1-3, Example 1-4, Example 1-5, Example 1-6, and Example 1-7 were adjusted to 2 mm, 3 mm, 5 mm, 6 mm, 7 mm, and 8 mm, respectively. The dimensions of the solid portions of Example 1-2, Example 1-3, Example 1-4, Example 1-5, Example 1-6, and Example 1-7 in the depth direction of the recessed portion were adjusted to 4 mm, 6 mm, 10 mm, 12 mm, 14 mm, and 16 mm, respectively.

Example 2-1 to Example 2-6

Samples according to Example 2-1, Example 2-2, Example 2-3, Example 2-4, Example 2-5, and Example 2-6 were obtained in the same manner as in Example 1-1, except that the width of the solid portion in the particular direction was changed to 1 mm, 2 mm, 3 mm, 5 mm, 6 mm, and 7 mm, respectively.

Example 3-1 to Example 3-5

Samples according to Example 3-1, Example 3-2, Example 3-3, Example 3-4, and Example 3-5 were obtained in the same manner as in Example 1-1, except that the width of the recessed portion in the particular direction was changed to 2 mm, 5 mm, 6 mm, 7 mm, and 8 mm, respectively.

Example 4-1 to Example 4-3

Samples according to Example 4-1, Example 4-2, and Example 4-3 were obtained in the same manner as in Example 1-1, except that the width of the solid portion in the particular direction and the width of the recessed portion in the particular direction were both changed to 3 mm, 5 mm, and 6 mm, respectively.

Example 5

A sample according to Example 5 was produced in the same manner as in Example 1-1, except for the following points. The side surface of the recessed portion in the incident-side principal surface was formed such that the recessed portion in the incident-side principal surface was tapered toward the emerging-side principal surface. An angle formed by the side surface of the recessed portion in the incident-side principal surface with a plane perpendicular to the particular direction was 27°.

Example 6-1 and Example 6-2

Samples according to Example 6-1 and Example 6-2 were obtained in the same manner as in Example 1-1, except that the dimension of the solid portion in the depth direction of the recessed portion was changed to 6 mm and 10 mm, respectively.

Comparative Example 1-1 to Comparative Example 1-4

Samples according Comparative Example 1-1, Comparative Example 1-2, Comparative Example 1-3, and Comparative Example 1-4 were obtained in the same manner as in Example 1-1, except for the following points. No recessed portions were provided in any of the surfaces of these samples according to Comparative Examples, and the samples according Comparative Example 1-1, Comparative Example 1-2, Comparative Example 1-3, and Comparative Example 1-4 were each in the shape of a flat plate having a thickness of 2 mm, 4 mm, 6 mm, and 8 mm, respectively.

Comparative Example 2

A sample according Comparative Example 2 was obtained in the same manner as in Example 1-1, except for the following points. In the sample according Comparative Example 2, each recessed portion was formed as a V-shaped groove, and the side surface of each recessed portion formed an angle of 45° with a plane perpendicular to the particular direction. In the sample according Comparative Example 2, a portion corresponding to the solid portion of Example 1-1 was not formed, and the edge of the recessed portion, namely the V-shaped groove, in the incident-side principal surface in the particular direction and a bottom of the recessed portion, namely the V-shaped groove, in the emerging-side principal surface were at the same position in the particular direction. Moreover, the edge of the recessed portion, namely the V-shaped groove, in the emerging-side principal surface in the particular direction and a bottom of the recessed portion, namely the V-shaped groove, in the incident-side principal surface were at the same position in the particular direction. The depth of each recessed portion was 2.8 mm, and the width of each recessed portion was 5.7 mm. The thickness (a dimension in the depth direction of the recessed portion) of the sample according Comparative Example 2 was constant at 5.7 mm.

As shown in Table 2, the transmission losses of the samples according to Examples in the straight direction are greater than the transmission losses of the samples according to Comparative Examples in the straight direction, which indicates that radio waves incident on the samples according to Examples pass through the samples in a well-scattered state.

TABLE 2

| | Depth D1 of recessed portion [mm] | Width W1 of solid portion [mm] | Opening width W2 of recessed portion [mm] | W1/(W1 + W2) | Inclination angle of side surface [°] | Dimension (thickness) of solid portion in depth direction of recessed portion [mm] | Transmission loss in straight direction [dB] |
|---|---|---|---|---|---|---|---|
| Example 1-1 | 4 | 4 | 4 | 0.50 | 0 | 8 | 8.8 |
| Example 1-2 | 2 | 4 | 4 | 0.50 | 0 | 4 | 4.2 |
| Example 1-3 | 3 | 4 | 4 | 0.50 | 0 | 6 | 6.5 |
| Example 1-4 | 5 | 4 | 4 | 0.50 | 0 | 10 | 6.9 |
| Example 1-5 | 6 | 4 | 4 | 0.50 | 0 | 12 | 4.3 |
| Example 1-6 | 7 | 4 | 4 | 0.50 | 0 | 14 | 2.9 |
| Example 1-7 | 8 | 4 | 4 | 0.50 | 0 | 16 | 4.5 |
| Example 2-1 | 4 | 1 | 4 | 0.20 | 0 | 8 | 4.6 |
| Example 2-2 | 4 | 2 | 4 | 0.33 | 0 | 8 | 8.6 |
| Example 2-3 | 4 | 3 | 4 | 0.43 | 0 | 8 | 8.9 |
| Example 2-4 | 4 | 5 | 4 | 0.56 | 0 | 8 | 6.0 |
| Example 2-5 | 4 | 6 | 4 | 0.60 | 0 | 8 | 5.7 |
| Example 2-6 | 4 | 7 | 4 | 0.64 | 0 | 8 | 3.7 |
| Example 3-1 | 4 | 4 | 2 | 0.67 | 0 | 8 | 4.9 |
| Example 3-2 | 4 | 4 | 5 | 0.44 | 0 | 8 | 8.8 |

TABLE 2-continued

|  | Depth D1 of recessed portion [mm] | Width W1 of solid portion [mm] | Opening width W2 of recessed portion [mm] | W1/(W1 + W2) | Inclination angle of side surface [°] | Dimension (thickness) of solid portion in depth direction of recessed portion [mm] | Transmission loss in straight direction [dB] |
|---|---|---|---|---|---|---|---|
| Example 3-3 | 4 | 4 | 6 | 0.40 | 0 | 8 | 10.2 |
| Example 3-4 | 4 | 4 | 7 | 0.36 | 0 | 8 | 11.5 |
| Example 3-5 | 4 | 4 | 8 | 0.20 | 0 | 8 | 6.8 |
| Example 4-1 | 4 | 3 | 3 | 0.50 | 0 | 8 | 8.3 |
| Example 4-2 | 4 | 5 | 5 | 0.50 | 0 | 8 | 7.1 |
| Example 4-3 | 4 | 6 | 6 | 0.50 | 0 | 8 | 6.5 |
| Example 5 | 4 | 4 | 4 | 0.50 | 27 | 8 | 3.5 |
| Example 6-1 | 4 | 4 | 4 | 0.50 | 0 | 6 | 7.8 |
| Example 6-2 | 4 | 4 | 4 | 0.50 | 0 | 10 | 10.1 |
| Comparative Example 1-1 | — | — | — | — | — | 2 | 0.7 |
| Comparative Example 1-2 | — | — | — | — | — | 4 | 0.4 |
| Comparative Example 1-3 | — | — | — | — | — | 6 | 0.3 |
| Comparative Example 1-4 | — | — | — | — | — | 8 | 0.7 |
| Comparative Example 2 | 2.8 | 0.0 | 5.7 | 0.50 | 45 | 5.7 | 1.7 |

The invention claimed is:

1. An electromagnetic shield comprising:
a plate-shaped base having a first surface and a second surface, the first surface being configured to allow an electromagnetic wave to be incident on the first surface, the second surface being distant from the first surface and extending along the first surface, wherein
the electromagnetic shield includes a dielectric,
the first surface includes: a plurality of first recessed portions arranged at a given interval in a particular direction along the first surface; and a first solid portion including a surface in contact with an edge of the first recessed portion in the particular direction, the surface being a basis of a depth of the first recessed portion, the first solid portion having a dimension in a depth direction of the first recessed portion, the dimension being equal to or greater than the depth of the first recessed portion, and
the second surface includes a plurality of second recessed portions arranged alternately with the plurality of first recessed portions in the particular direction.

2. The electromagnetic shield according to claim 1, wherein the electromagnetic shield is free of an electrically conductive portion.

3. The electromagnetic shield according to claim 1, wherein an imaginary part $\varepsilon''$ of a relative permittivity of the dielectric at at least one frequency in a range of 10 GHz to 300 GHz is 0.1 or less.

4. The electromagnetic shield according to claim 1, wherein a real part $\varepsilon'$ of a relative permittivity of the dielectric at at least one frequency in a range of 10 GHz to 300 GHz is 2.0 to 4.0.

5. The electromagnetic shield according to claim 1, wherein
the electromagnetic shield is capable of shielding against an electromagnetic wave with a wavelength $\lambda$, and
the depth of the first recessed portion is 0.50$\lambda$ to 2.10$\lambda$.

6. The electromagnetic shield according to claim 1, wherein
the electromagnetic shield is capable of shielding against an electromagnetic wave with a wavelength $\lambda$, and
an opening width of the first recessed portion in the particular direction is 0.50$\lambda$ to 2.10$\lambda$.

7. The electromagnetic shield according to claim 1, wherein
the electromagnetic shield is capable of shielding against an electromagnetic wave with a wavelength $\lambda$, and
a width of the first solid portion in the particular direction is 0.20$\lambda$ to 2.0$\lambda$.

8. The electromagnetic shield according to claim 1, wherein
the electromagnetic shield is capable of shielding against an electromagnetic wave with a wavelength $\lambda$, and
a ratio of a width of the first solid portion in the particular direction to a sum of the width of the first solid portion in the particular direction and an opening width of the first recessed portion in the particular direction is 0.1 to 0.9.

9. The electromagnetic shield according to claim 1, wherein the second recessed portion has the same shape as the first recessed portion.

10. The electromagnetic shield according to claim 1, wherein
the second surface includes a second solid portion including a surface in contact with an edge of the second recessed portion in the particular direction, the surface being a basis of a depth of the second recessed portion, the second solid portion having a dimension in a depth direction of the second recessed portion, the dimension being equal to or greater than the depth of the second recessed portion, and
the second solid portion has the same shape as the first solid portion.

11. The electromagnetic shield according to claim 10, wherein the first surface and the second surface are configured such that a unit structure including the first recessed portion, the second recessed portion, the first solid portion, and the second solid portion repeats in the particular direction.

12. The electromagnetic shield according to claim 1, wherein
a side surface of the first recessed portion extends toward the second surface and perpendicularly to the particular direction or is tapered toward the second surface, and the side surface of the first recessed portion forms an angle of 0° or more and 30° or less with a plane perpendicular to the particular direction.

13. The electromagnetic shield according to claim 1, wherein
at least one of the electromagnetic shield and the base is a ring-shaped body and has a polygonal or circular outer perimeter when the first surface is viewed along an axis of the ring-shaped body,
the electromagnetic shield further comprises a contact portion configured to be in contact with a component other than the electromagnetic shield, and
the contact portion abuts on the outer perimeter.

14. The electromagnetic shield according to claim 1, wherein
at least one of the electromagnetic shield and the base is a hollow body whose outer shape is a truncated pyramidal shape, a truncated conical shape, or a truncated elliptical conical shape and which has an opening in each of positions in the outer shape, the positions corresponding to an upper base and a lower base of a truncated pyramid, a truncated cone, or a truncated elliptic cone,
the first surface defines an inner peripheral surface of the hollow body being the electromagnetic shield or the base, and
the second surface defines an outer peripheral surface of the hollow body being the electromagnetic shield or the base.

\* \* \* \* \*